(12) United States Patent
Yamaguchi

(10) Patent No.: US 8,643,131 B2
(45) Date of Patent: Feb. 4, 2014

(54) SOLID-STATE IMAGING DEVICE AND METHOD OF MANUFACTURING THE SAME

(75) Inventor: Tetsuya Yamaguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 519 days.

(21) Appl. No.: 12/980,769

(22) Filed: Dec. 29, 2010

(65) Prior Publication Data

US 2011/0227185 A1  Sep. 22, 2011

(30) Foreign Application Priority Data

Mar. 19, 2010  (JP) .................................. 2010-064747

(51) Int. Cl.
*H01L 31/0232* (2006.01)
*H01L 21/30* (2006.01)

(52) U.S. Cl.
USPC .......................................... 257/432; 257/436

(58) Field of Classification Search
USPC .................. 257/290–293, 431–448, E31.003
See application file for complete search history.

(56) References Cited

U.S. PATENT DOCUMENTS

| 7,554,141 | B2 | 6/2009 | Yamaguchi et al. |
|---|---|---|---|
| 8,217,479 | B2 * | 7/2012 | Oshiyama et al. ............. 257/431 |
| 8,497,546 | B2 * | 7/2013 | Hynecek ....................... 257/323 |
| 2005/0156213 | A1 | 7/2005 | Han et al. |
| 2006/0033129 | A1 | 2/2006 | Mouli |
| 2006/0273359 | A1 | 12/2006 | Mori |
| 2008/0087977 | A1 | 4/2008 | Watanabe |

FOREIGN PATENT DOCUMENTS

| CN | 1855520 A | 11/2006 |
|---|---|---|
| JP | 1-161757 | 6/1989 |
| JP | 2006-128392 | 5/2006 |
| JP | 2006-286933 | 10/2006 |
| JP | 2007-329336 | 12/2007 |
| JP | 2008-78302 | 4/2008 |
| JP | 2008-510316 | 4/2008 |
| JP | 2009-182223 | 8/2009 |
| JP | 2010-62315 | 3/2010 |
| JP | 2011-54741 | 3/2011 |
| JP | 2011-86877 | 4/2011 |

OTHER PUBLICATIONS

U.S. Appl. No. 12/877,654, filed Sep. 8, 2010, Tetsuya Yamaguchi.
Notification of the First Office Action issued Dec. 3, 2012 in Chinese Patent Application No. 201110066617.X (with English translation).
Japanese Office Action issued Jul. 10, 2012, in Japan Patent Application No. 2010-064747 (with English translation).
Office Action mailed Jul. 19, 2013 in Chinese Application No. 201110066617.X (w/English translation).

* cited by examiner (Continued)

Primary Examiner — Cuong Q Nguyen
(74) Attorney, Agent, or Firm — Oblon, Spivak, McClelland, Maier & Neustadt, L.L.P.

(57) ABSTRACT

According to one embodiment, a solid-state imaging device includes a diffusion layer, first and second diffusion layers, and p-type amorphous silicon compound. The diffusion layer of a first conduction type is formed in a surface of a semiconductor substrate of the first conduction type. The diffusion layer functions as a charge accumulation part for accumulating electrons generated in the semiconductor substrate by light emitted from a back side of the semiconductor substrate to a surface side. The first and second diffusion layers of a second conduction type sandwich the charge accumulation part and are formed so as to reach the inside of the semiconductor substrate from the surface of the semiconductor substrate. The p-type amorphous silicon compound electrically isolates the charge accumulation part and is buried in the first and second trenches formed on the back side of the semiconductor substrate.

13 Claims, 8 Drawing Sheets

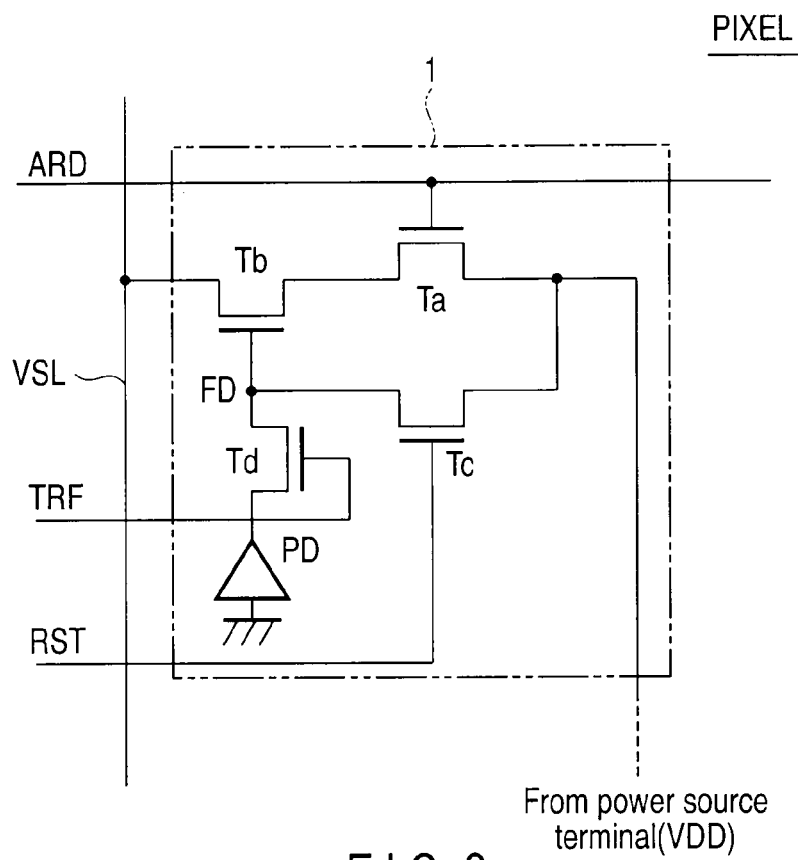
F I G. 2
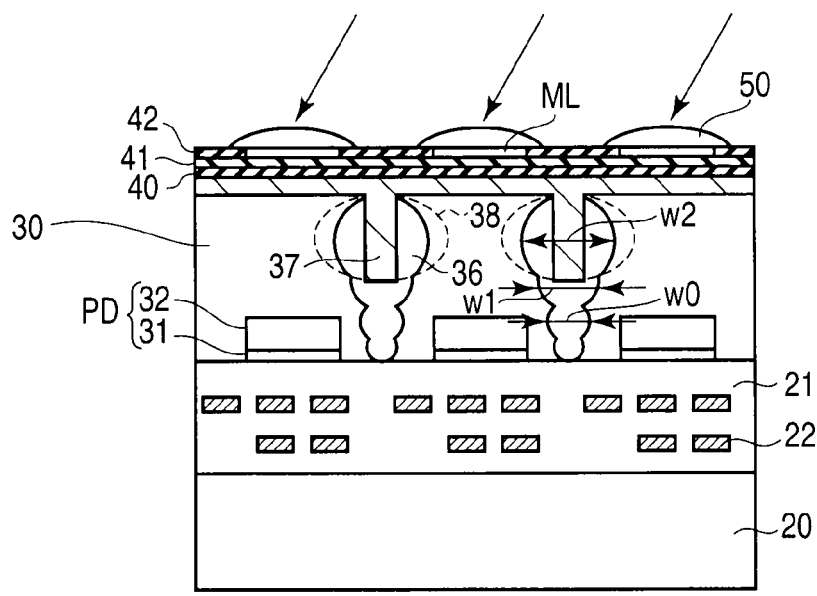
F I G. 3

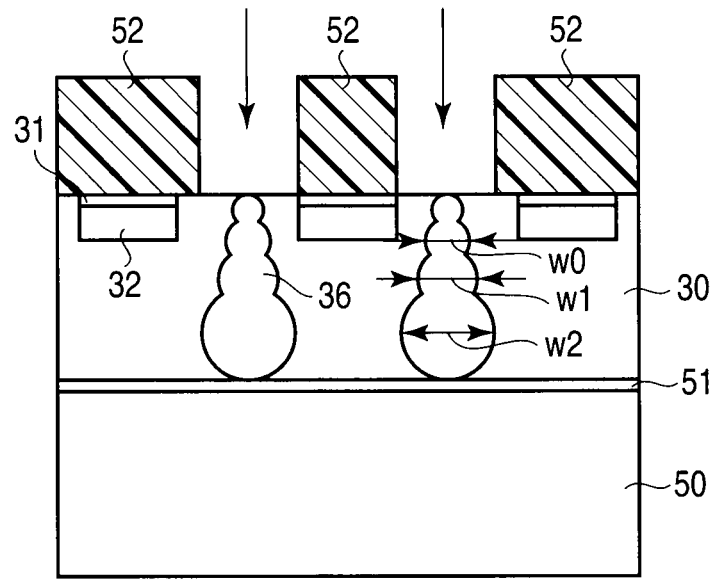
F I G. 4
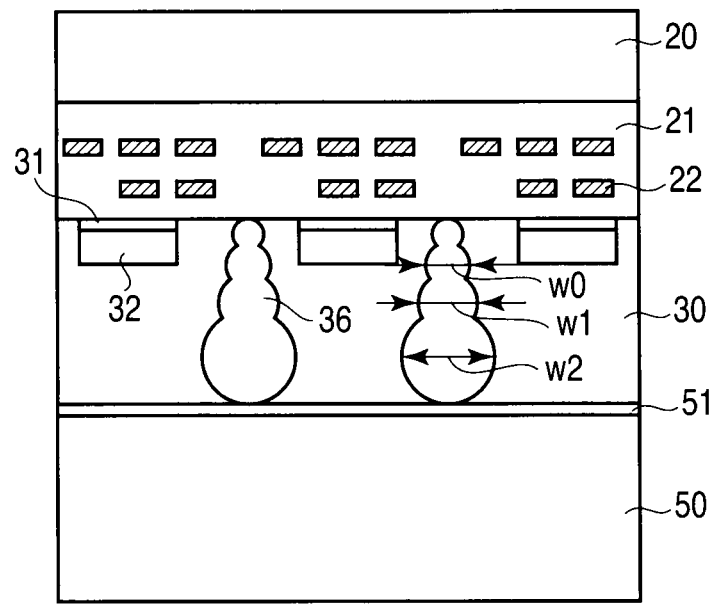
F I G. 5

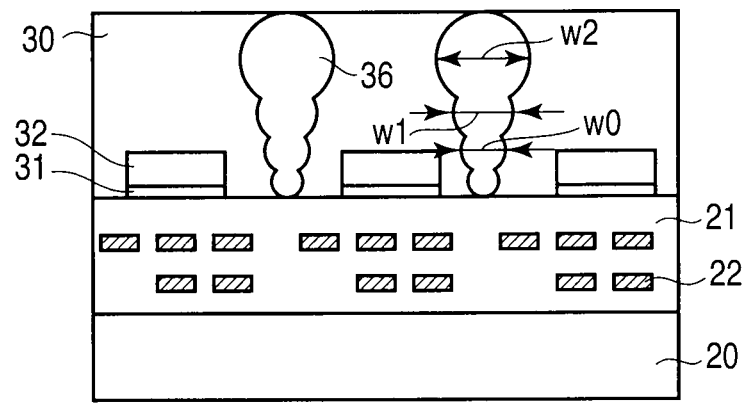
F I G. 6
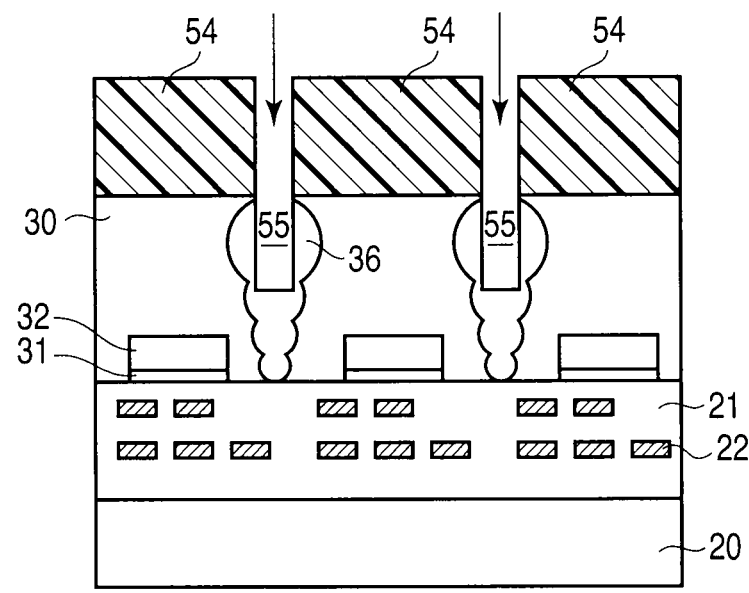
F I G. 7

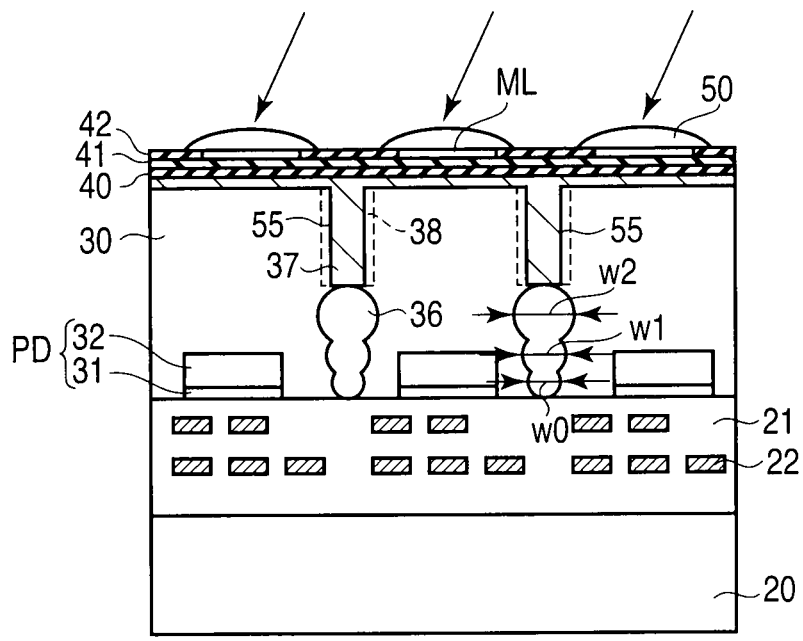
F I G. 10
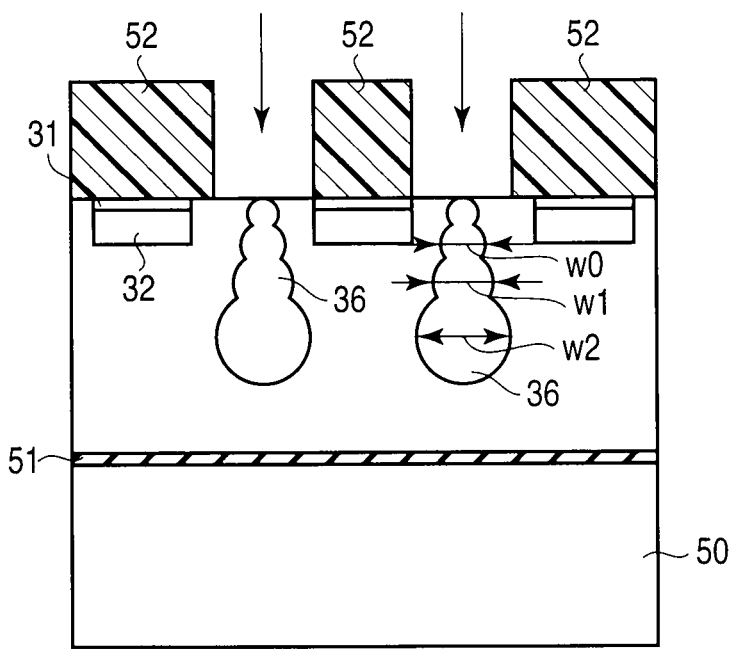
F I G. 11

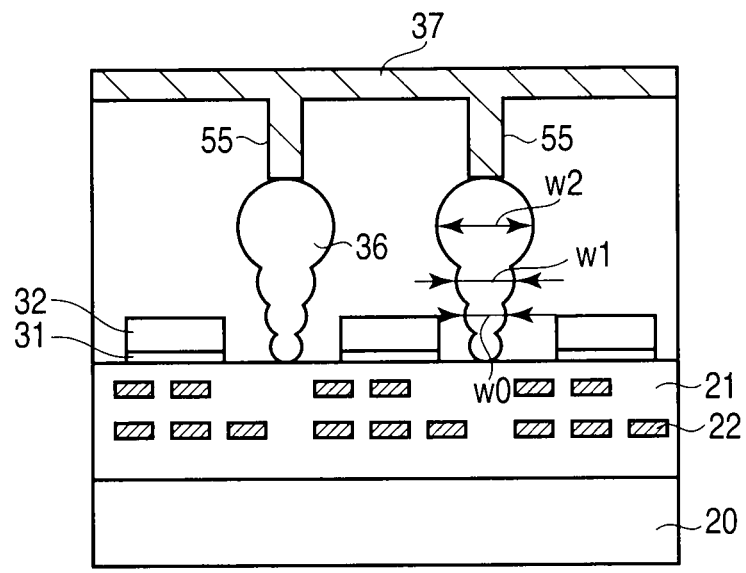
F I G. 12
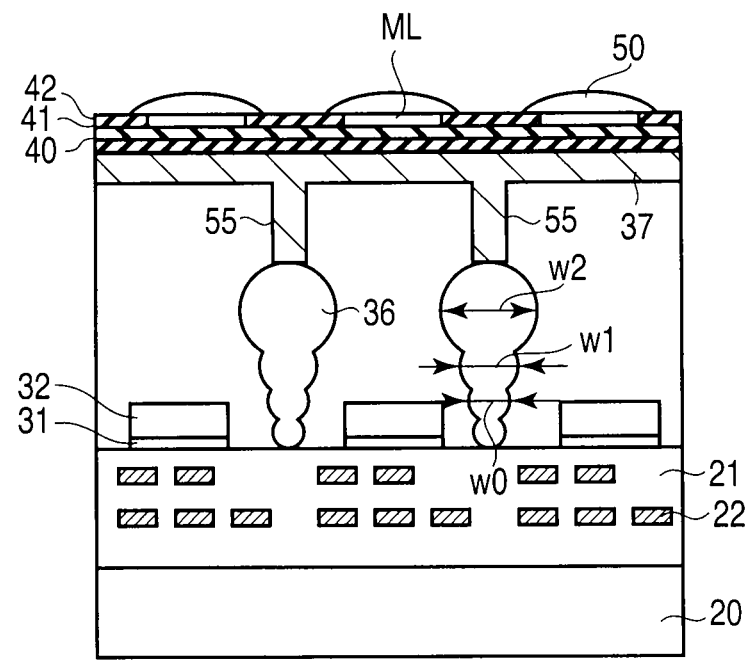
F I G. 13

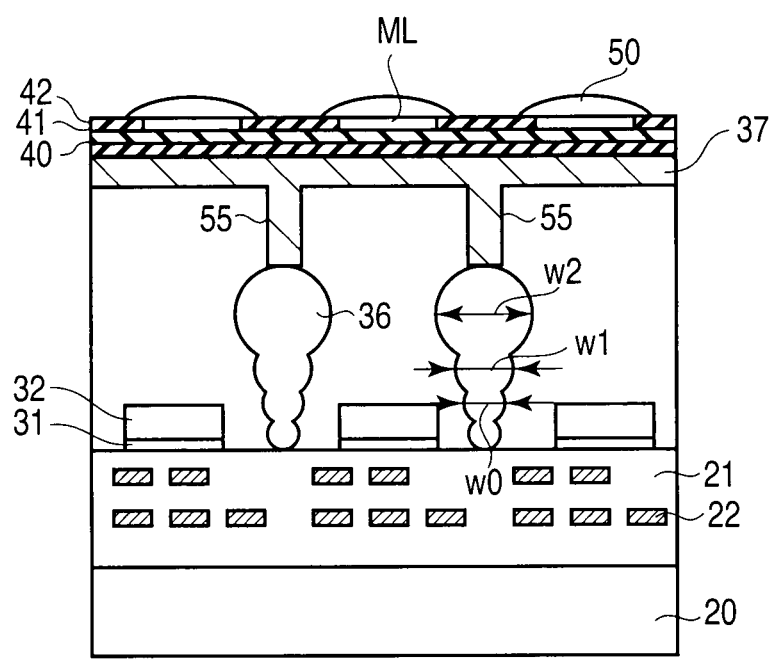
F I G. 14

US 8,643,131 B2

SOLID-STATE IMAGING DEVICE AND METHOD OF MANUFACTURING THE SAME

CROSS-REFERENCE TO RELATED APPLICATIONS

This application is based upon and claims the benefit of priority from Japanese Patent Application No. 2010-064747, filed Mar. 19, 2010; the entire contents of which are incorporated herein by reference.

FIELD

Embodiments described herein relate generally to a solid-state imaging device and a method of manufacturing the same.

BACKGROUND

Recently, since pixels are becoming smaller and smaller, for example, Jpn. Pat. Appln. KOKAI Publication No. 2006-128392 describes that, a back side illumination (BSI) solid-state imaging device is proposed mainly for the purpose of increasing aperture ratio.

In a solid-state imaging device of the back side illumination type, electrons generated on the light irradiation face side are not counted as signals unless they reach a photodiode (PD) on an interconnect side. Consequently, the sensitivity is determined according to the thickness of a silicon (Si) substrate for performing photoelectric conversion (the thicker the silicon substrate, the higher the sensitivity). In this case, the number of carriers (electrons) generated by the photoelectric conversion is greater on the light irradiation face side in the silicon substrate and decreases toward the PD. In the silicon substrate near the light irradiation face side, since it is far from the PD, the electric field generated by the PD (the electric field which makes electrons concentrated in the PD) is weak. That is, the region is a weak electric field region.

Generally, an element isolation layer is formed by a p-type semiconductor layer obtained by implanting boron (B) ions to the silicon substrate. However, when boron is implanted to a deep part in the silicon substrate at high acceleration, an ion damage occurs, boron ions are scattered, and the boron concentration in the element isolation layer becomes effectively low, so that the element isolation capability deteriorates.

In the solid-state imaging device of the back side illumination type, many carriers occur on the light irradiation face side. However, they are generated in the weak electric field region. A considerable amount of carriers are moved by diffusion.

The carriers moved by the diffusion leak to adjacent pixels and color crosstalk are caused. In the BSI, there is a tendency that color crosstalk at the time of emitting short-wavelength light (blue light) occurs more than a solid-state imaging device of the surface irradiation type.

Consequently, an object of the BSI is to reduce color crosstalk of short-wavelength light. Generally, as means, the thickness of the silicon substrate in which a PD is formed is reduced, and the distance between the light irradiation face side in the silicon substrate and the PD is shortened.

However, there is a problem that reduction of the thickness of the silicon substrate causes decrease in sensitivity to green (G) and red (R) light. As described above, there is a tendency that the conventional solid-state imaging device of the back side illumination type and its manufacturing method are disadvantageous with respect to color crosstalk or the like caused by carriers generated on the light irradiation face side.

BRIEF DESCRIPTION OF THE DRAWINGS

FIG. 2 is a circuit diagram showing a configuration example of an imaging region according to the first embodiment;

FIG. 3 is a cross-sectional view showing a configuration example of the solid-state imaging device according to the first embodiment;

FIG. 4 to FIG. 9 are cross-sectional views showing a first to sixth manufacturing process of the solid-state imaging device according to the first embodiment;

FIG. 10 is a cross-sectional view of a solid-state imaging device according to a second embodiment;

FIG. 11 to FIG. 13 are cross-sectional views showing first to third manufacturing process of the solid-state imaging device according to the second embodiment; and FIG. 14 is a cross-sectional view of a solid-state imaging device according to a modification.

DETAILED DESCRIPTION

Embodiments will be described below with reference to the drawings. In the description, in all of the drawings, common reference numbers denote common parts.

First Embodiment

The following embodiment relates to an example of a solid-state imaging device of the back side illumination (BSI) type in which a light illumination surface (light reception surface) is provided on the back side of a semiconductor substrate opposite to the surface of the semiconductor substrate in which a signal scan circuit is formed.

In general, according to one embodiment, a solid-state imaging device includes a diffusion layer, first and second diffusion layers, and p-type amorphous silicon compound. The diffusion layer of a first conduction type is formed in a surface of a semiconductor substrate of the first conduction type. The diffusion layer functions as a charge accumulation part for accumulating electrons generated in the semiconductor substrate by light emitted from a back side of the semiconductor substrate to a surface side. The first and second diffusion layers of a second conduction type sandwich the charge accumulation part and are formed so as to reach the inside of the semiconductor substrate from the surface of the semiconductor substrate. The p-type amorphous silicon compound electrically isolates the charge accumulation part and is buried in the first and second trenches formed on the back side of the semiconductor substrate.

1. Configuration Example

Figure 1:
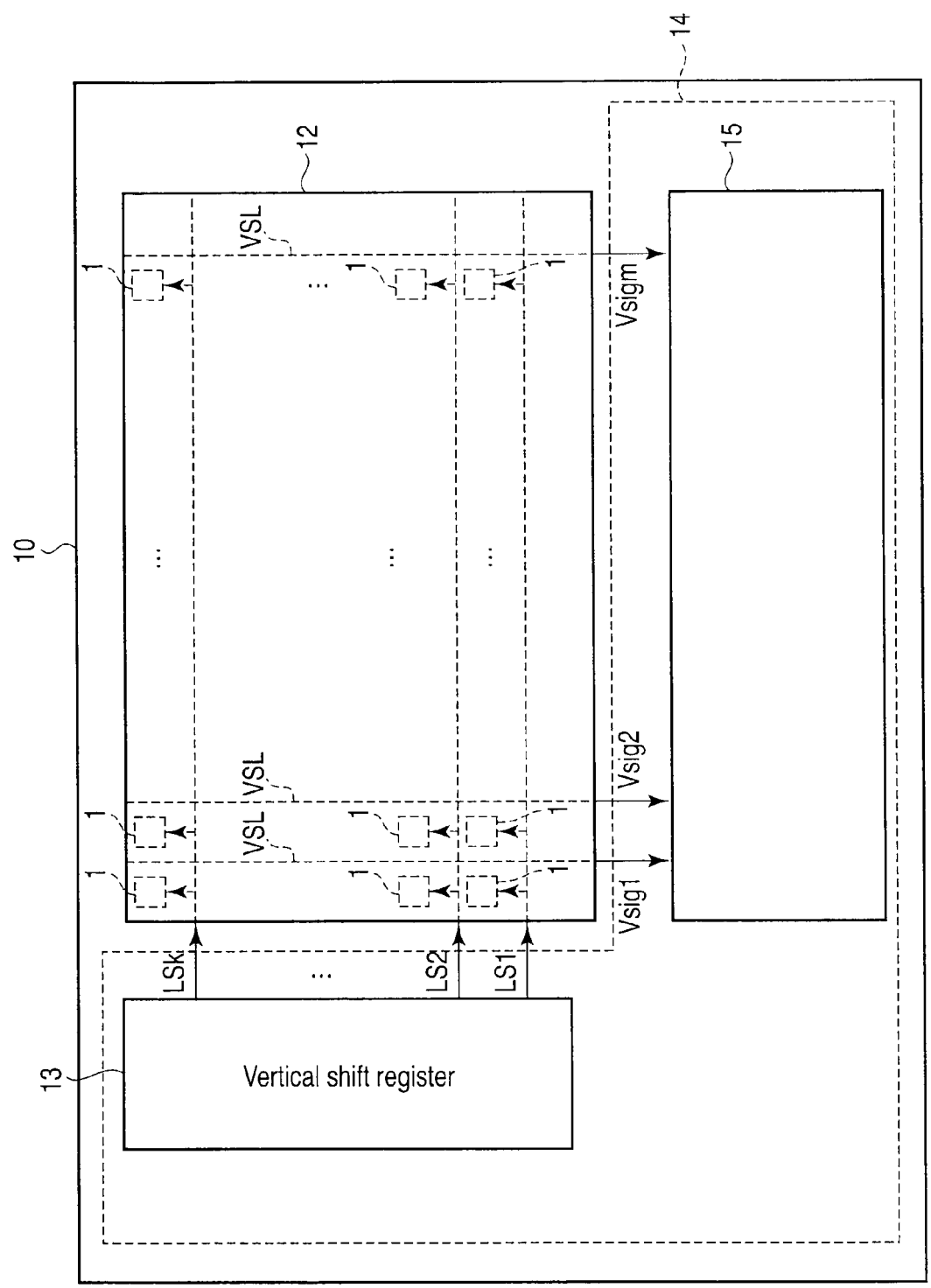
FIG. 1 is a block diagram showing a general configuration of a solid-state imaging device according to a first embodiment.

A configuration example of a solid-state imaging device according to a first embodiment will be described with reference to FIG. 1 and FIG. 2.

1-1. General Configuration Example

First, referring to FIG. 1, a general configuration example of a solid-state imaging device according to the embodiment will be described. FIG. 1 is a system block diagram showing the general configuration example of the solid-state imaging device according to the embodiment. FIG. 1 shows a configuration of the case where an analog-to-digital conversion circuit is disposed in a column position in an imaging region.

As shown in the diagram, a solid-state imaging device 10 according to the embodiment includes an imaging region 12 and a drive circuit region 14.

In the imaging region 12, a matrix of pixels 1 each including a photoelectric converter and a signal scan circuit is disposed.

The photoelectric converter includes a photodiode for converting light to electricity and storing the electricity, and functions as an imaging part. The signal scan circuit includes an amplifier transistor which will be described later and the like, reads and amplifies a signal from the photoelectric converter, and transmits the resultant signal to an analog-to-digital conversion circuit 15. In the case of the embodiment, a light irradiation face (photoelectric converter) is provided on the back side of the semiconductor substrate opposite to the surface of the semiconductor substrate in which the signal scan circuit is formed.

The drive circuit region 14 is obtained by arranging drive circuits such as a vertical shift register 13 and the analog-to-digital conversion circuit 15 for driving the signal scan circuit.

The vertical shift register 13 functions as a selector for outputting signals SL1 to SLk to the imaging region 12, and selecting the pixels 1 on the row unit basis. From each of the pixels 1 in the selected row, an analog signal Vsig according to the amount of incident light is output via a vertical signal line VSL.

The analog-to-digital conversion (ADC) circuit 15 digitizes the analog signal Vsig input via the vertical signal line VSL.

Although a part of the general configuration of the solid-state imaging device has been illustrated and described, the configuration is not limited to the above. For example, a controller for controlling the operation of the imaging region 12 and the like may be further provided. A configuration in which the ADC circuit 15 is not disposed in parallel to the columns but is disposed at the chip level, a configuration in which the ADC circuit 15 is not disposed on a sensor chip, and the like may be employed.

1-2. Configuration Example of Imaging Region

Referring now to FIG. 2, a configuration example of the pixel 1 in the imaging region 12 in FIG. 1 will be described. The embodiment will be described by exemplifying a single-chip imaging device which obtains a plurality of pieces of color information with a single imaging region 12.

As shown in the diagram, the pixels 1 are disposed in intersecting positions of the read signal lines and the vertical signal lines VSL from the vertical shift register 13.

The pixel 1 includes a photodiode PD, an amplification transistor Tb, a read transistor Td, a reset transistor Tc, and an address transistor Ta.

In the configuration of the pixel 1, the photodiode PD constitutes a photoelectric converter including, for example, an n-type diffusion layer. The amplification transistor Tb, the read transistor Td, the reset transistor Tc, and the address transistor Ta constitute a signal scan circuit.

A reference potential Vss is given to the cathode of the photodiode PD.

The amplification transistor Tb amplifies a signal from a floating diffusion layer (detector) FD and outputs the amplified signal. The gate of the amplification transistor Tb is connected to the floating diffusion layer FD, the source is connected to the vertical signal line VSL, and the drain is connected to the source of the address transistor Ta. The output signal of the pixel 1 transmitted via the vertical signal line VSL is output from an output terminal, after noise is removed by a not-shown CDS noise removing circuit.

The read transistor Td is configured to control accumulation of signal charges in the photodiode PD. The gate of the read transistor Td is connected to a read signal line TRF, the source is connected to the anode of the photodiode PD, and the drain is connected to the floating diffusion layer FD.

The reset transistor Tc is configured to reset the gate potential of the amplification transistor Tb. The gate of the reset transistor Tc is connected to a reset signal line RST, the source is connected to the floating diffusion layer FD, and the drain is connected to a power source terminal. An internal voltage VDD is supplied to the drain.

The gate of the address transistor Ta is connected to an address signal line ADR.

Read Operation

The read operation in the pixel 1 in the imaging region 12 is performed as follows. First, the address transistor Ta in a read row turns on in response to a row selection pulse sent from the vertical shift register 13.

Subsequently, the transfer gate Td turns on, the signal charges accumulated in the photodiode PD are transferred to the floating diffusion layer FD, and the potential of the floating diffusion layer FD is modulated according to the number of signal charges transferred.

The modulated signal is sent to the vertical signal line VSL by the MOS transistor Tb, a component of a source follower, and a not-shown MOS transistor, and the reading operation is completed.

1-3. Sectional Configuration Example

Referring now to FIG. 3, a sectional configuration example of the solid-state imaging device according to the embodiment will be described. In the sectional configuration example of the solid-state imaging device described below, attention is paid particularly to the photoelectric converter, that is, the photodiode PD. Just below the photoelectric converter, an interconnect layer connected to the signal scan circuit is provided.

As shown in FIG. 3, an interlayer insulating film 21 is formed on a first supporting substrate 20 made of, for example, silicon. Above the first supporting substrate 20, an interconnect layer 22 is formed. That is, the interlayer insulating film 21 is formed above the first supporting substrate 20 so as to cover the interconnect layer 22. The interconnect layer 22 is made of aluminum (Al), copper (Cu), or the like and is an interconnect formed on the signal scan line circuit side. A silicon substrate 30 of the n type is formed on the interlayer insulating film 21. The semiconductor substrate 30 is, for example, an n-type semiconductor layer formed by epitaxial growth on an SOI substrate. In the case of the embodiment, the thickness of the semiconductor substrate 30 is, for example, about 2.4 µm.

In the surface of the silicon substrate 30, a p-type diffusion layer 31 and an n-type diffusion layer 32 formed on the p-type diffusion layer 31 are formed. Electrons generated in the silicon substrate 30 by light incident from the back side (in FIG. 3, the side of an insulating film 40) toward the first supporting substrate are accumulated in the n-type diffusion layer 32. That is, the electric field is applied from the back side of the silicon substrate 30 toward the first supporting substrate, the generated electrons travel toward the n-type diffusion layer 32, and holes generated in pairs with the electrons travel toward the insulating film 40 and are absorbed by the grounded diffusion layer (not shown). That is, the n-type diffusion layer 32 as a component of the photodiode PD functions as a charge accumulating layer which accumulates electrons.

The pixel 1 is formed by the p-type diffusion layer 31 and the n-type diffusion layer 32 constituting the photodiode PD and the MOS transistors Tb, Tc, and Td (not shown).

A pixel isolation layer 36 is formed by ion implantation so as to penetrate the silicon substrate 30. In the pixel isolation layer 36, for example, a material such as boron (B) ions, different from that of the silicon substrate 30, are implanted. The pixel isolation layer 36 is formed between adjacent photodiodes PD. With the configuration, the plurality of adjacent photodiodes PD are electrically isolated from each other.

The width "w" of the pixel isolation layer 36 increases toward the back side (in FIG. 3, w0<w1<w2). The reason is that the energy at the time of implanting ions toward the back side, that is, acceleration voltage has a value according to the depth. Specifically, toward the back side, that is, with increase in distance from the photodiode PD side, higher implantation energy is necessary. The implanted ions are scattered and diffused isotropically in the silicon substrate 30. Consequently, the pixel isolation layer 36 having a concentric shape is sequentially formed toward the back face.

Further, a p-type amorphous silicon compound film 37 is provided in the pixel isolation layer 36. Concretely, the p-type amorphous silicon compound film 37 is provided in a trench formed in the pixel isolation layer 36 from the back side. The amorphous silicon compound 37 is a so-called p-type a-SiC film containing carbon (C). The a-SiC film 37 has a band gap (about 2.0 eV) wider than the band gap (about 1.1 eV) of silicon (Si). The concentration of boron contained in the a-SiC film 37 is, preferably, concentration at which a portion near the surface of the pixel isolation layer 36 is not depleted and dark current is sufficiently low, for example, $1E17\ cm^{-3}$ or higher. In the silicon substrate 30 on the incident side (a region in which the a-SiC film 37 is buried in the pixel isolation layer 36), a hole storage layer 38 is formed. Since the a-SiC film 37 is a p-type semiconductor layer, the hole storage layer is formed near the surface of the pixel isolation layer 36. Also in the interface between the semiconductor substrate 30 on the light irradiation face side and the insulating film 40 (hereinafter called a near BF), a hole accumulation layer is formed by the p-type a-SiC film 37 (not shown).

The silicon insulating film 40 is formed on the entire bottom face (back side) of the silicon substrate 30, a passivation film 41 made of, for example, $Si_3N_4$ is formed on the silicon insulating film 40 and, further, a planarization layer 42 is formed on the passivation film 41. The planarization layer 42 is formed by, for example, a silicon oxide ($SiO_2$) film. In the planarization layer 42, microlenses ML are formed and lenses 50 are formed on the planarization layer 42. Not-shown color filters CF are formed in the planarization layer 42. For example, in the case of a Bayer arrangement, the color filters CF are disposed in correspondence with colors of red (R), green (G), and blue (B).

2. Manufacturing Method

With reference to FIGS. 4 to 9, a method of manufacturing the solid-state imaging device according to the first embodiment will be described.

First, as shown in FIG. 4, an n-type semiconductor layer is epitaxial-grown to, for example, about 2.4 μm on a silicon-on-insulator (SOI) substrate 50 via a silicon oxide film 51, thereby forming the semiconductor substrate (Si-sub) 30 of the n-type. Subsequently, the photodiode PD is formed in the semiconductor substrate 30 on the signal scan line side (surface side) by using a known CMOS sensor manufacturing method. Further, a photoresist film 52 is stacked on the semiconductor substrate 30 and is patterned in a desired pattern. After that, boron ions are doped at high acceleration toward the surface of the semiconductor substrate 30. The acceleration voltage is, for example, about 3.0 eV. With the voltage, the pixel isolation layer 36 penetrating the semiconductor substrate 30 is formed. After that, the photoresist film 52 is removed with an etching solution or the like.

Next, as shown in FIG. 5, the interlayer insulating film 21 and the interconnect layer 22 are sequentially formed on the semiconductor substrate 30. After that, the first supporting substrate 20 is formed on the interlayer insulating film 21. At this time, the first supporting substrate 20 is formed on the interlayer insulating film 21 by using an adhesive or a direct joining method.

As shown in FIG. 6, the device is turned upside down so that the first supporting substrate 20 is positioned on the bottom side in the configuration of FIG. 5, and the semiconductor substrate 30 is positioned above the first supporting substrate 20. The SOI substrate 50 and the silicon oxide film 51 are etched to a desired thickness. When the thickness reaches a predetermined thickness, for example, by using chemical mechanical polishing (CMP), the device is polished until the surface of the semiconductor substrate 30 is exposed.

The silicon oxide layer 51 formed on the SOI substrate 50 may be left. In this case, when the thickness of the silicon oxide layer (SOI layer) 51 is greater than a desired thickness, as necessary, for example, the thickness of the silicon oxide layer 51 is further reduced to a desired thickness (for example, about 50 nm) with, for example, $NF_4OH$, HF, or a mixed liquid of HF, $HNO_3$, and $CH_3COOH$. When the SOI substrate 50 with the silicon oxide layer 51 having a thickness of about 0.1 μm (100 nm) or less is used from the beginning, the process of thinning the silicon oxide layer 51 is unnecessary.

As shown in FIG. 7, a photoresist film 54 is formed on the semiconductor substrate 30 and, after that, patterned in a desired pattern. Further, by using the reactive ion etching (RIE) method, a trench 55 is formed in a part of the pixel isolation layer 36 formed in the semiconductor substrate 30. The depth of the trench is about 1.5 μm. The reason for this depth of the trench is because the depth of a weak electric field region on the back side is about 1.5 μm.

Figure 8:
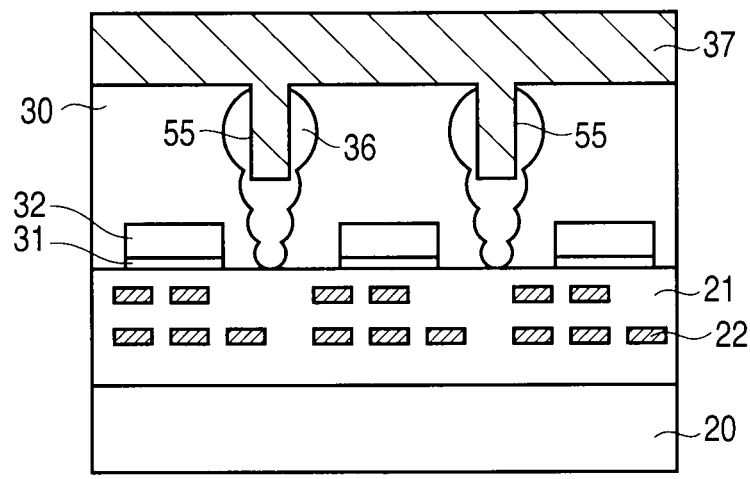

As shown in FIG. 8, after removal of the photoresist film 54, the p-type a-SiC film 37 is buried in the trench 55 by using, for example, plasma chemical vapor deposition (CVD) or the like. The a-SiC film 37 is deposited also on the semiconductor substrate 30. Parameters for forming the a-SiC film 37 will be described below. Gaseous $SiH_4$ at 100 SCCM, gaseous $H_2$ at 50 SCCM, gaseous $CH_4$ at 20 SCCM, and gaseous $B_2H_6$ at 8 SCCM are passed under a pressure of 0.5 Torr or less. An output of a plasma CVD apparatus is set to 30 W/cm² and, for example, the temperature of the silicon substrate 30 shown in FIG. 6 is set to 230 degrees. By depositing the a-SiC film 37 for about 20 minutes with the parameters, the film thickness of about 2 μm is obtained.

Figure 9:
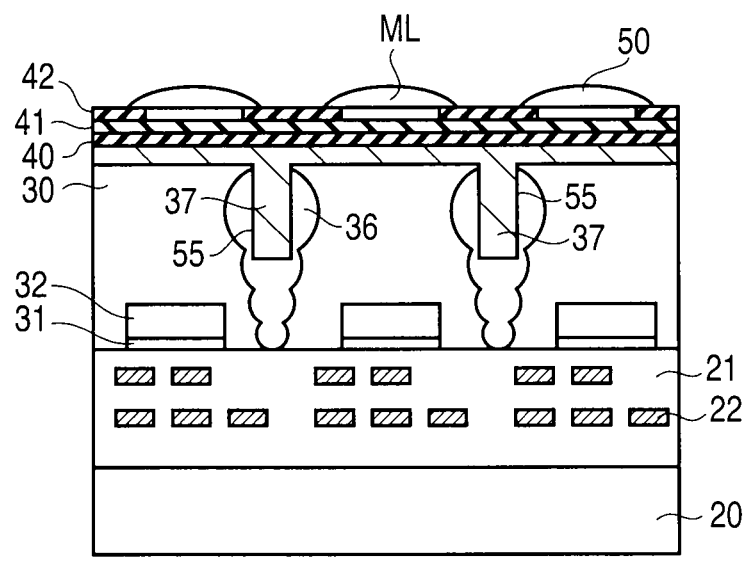

As shown in FIG. 9, the a-SiC film 37 deposited on the semiconductor substrate 30 is polished and planarized. After that, the silicon insulating film 40, the passivation film 41 formed by, for example, an $Si_3N_4$ film, and the planarization layer 42 are formed sequentially on the a-SiC film 37, and the lenses 50 are formed on the planarization layer 42. In such a manner, the solid-state imaging device shown in FIG. 3 is formed.

Although the first embodiment has been described by using the substrate obtained by epitaxial-growing the n-type silicon (Si) film on the SOI substrate, the first embodiment is not limited to the case. For example, the SOI substrate may not be used. The first embodiment can be similarly applied to the case of using a bulk silicon substrate, an SIMOX substrate, or the like.

3. Effects

With the solid-state imaging device according to the first embodiment and the method of manufacturing the same, at least the following effects (1) to (3) are obtained.

(1) By preventing occurrence of depletion of the element isolation region part on the light irradiation face side, dark current can be reduced.

As described above, the solid-state imaging device according to the embodiment is a solid-state imaging device of the back side illumination type including the imaging region 12 in which the plurality of pixels 1 including the photoelectric converter (PD) and the signal scan circuit are provided on the semiconductor substrate 30, and in which a light irradiation face is formed on the surface of the substrate on the side opposite to the surface of the semiconductor substrate 30 in which the signal scan circuit is formed. Further, the solid-state imaging device according to the embodiment includes the pixel isolation layer 36 provided so as to penetrate the semiconductor substrate 30, and the a-SiC film 37 buried in the trench 55 provided in the pixel isolation layer 36 from the back side.

In the solid-state imaging device according to the embodiment, the hole storage layer 38 is formed on the light irradiation face side and in the interface between the pixel isolation layer 36 and the semiconductor substrate 30. The reason is that, as described above, the semiconductor substrate 30 is of the n type, and the a-SiC film 37 is a p-type semiconductor layer.

With the configuration, the hole storage layer 38 can be disposed near the pixel isolation layer 36 which includes many defects being a source of generating dark current. Consequently, the hole concentration on the back side is increased, and occurrence of depletion near the pixel isolation layer 36 on the back side can be suppressed. Therefore, dark current generated near the pixel isolation layer 36 can be suppressed.

(2) The pixel isolation layer 36 functioning as an element isolation layer can be reinforced and mixture of colors can be reduced.

In the solid-state imaging device according to the embodiment, the band gap of the a-SiC film 37 is about 2.0 eV which is usually wider than the band gap (1.1 eV) of silicon (Si), and the absorption coefficient of short-wavelength light of the a-SiC film 37 is less than that of silicon, so that drop in sensitivity to blue light (for example, 450 nm) can be suppressed. Since the band gap of the a-SiC film 37 is wider than that of silicon, an effect of suppressing leakage of carriers (electrons) to adjacent pixels over the element isolation region including the a-SiC layer 37 is large. That is, blooming and color crosstalk can be suppressed.

(3) The operation reliability can be improved.

In the solid-state imaging device according to the embodiment, the a-SiC film 37 is buried in the trench 55 under the condition of 230 degrees. Since the device is not manufactured at high temperature, fluctuations in the thresholds of the read transistor, the reset transistor, and the like can be suppressed. That is, in a manufacturing process, while suppressing fluctuations in the thresholds of the read transistor and the reset transistor in the periphery, the a-SiC film 37 can be formed. That is, the pixel 1 with high reliability can be provided.

Since the film formation temperature is relatively low such as about 230 degrees in the process of forming the a-SiC (p) layer 33, even after formation of the interconnect layer 22 of Al, Cu, or the like, the a-SiC (p) layer 33 can be formed without deteriorating the interconnect characteristics of the interconnect layer 22.

Second Embodiment

A solid-state imaging device according to a second embodiment will be described with reference to FIG. 10. Only the configuration different from that of the solid-stage imaging device according to the first embodiment will be described, and the same reference number is used for the same member.

1. Configuration Example

As shown in FIG. 10, in the solid-state imaging device according to the embodiment, the p-type a-SiC film 37 is formed below the pixel isolation layer (P-type semiconductor layer) 36 formed by implantation of boron (B) ions seen from the first supporting substrate side. By the pixel isolation layer (P-type semiconductor layer) 36 and the p-type a-SiC film 37, the structure functioning as the element isolation region which electrically isolates the adjacent photodiodes PD from each other is obtained. That is, the structure in which at least a part of the pixel isolation layer 36 and a part of the p-type a-SiC film 37 are connected is obtained. In other words, in the epitaxially-grown n-type semiconductor substrate 30, the structure in which the pixel isolation layer 36 and the p-type a-SiC film 37 are connected is employed. Therefore, the silicon substrate 30 which effectively performs photoelectric conversion can be made thicker than that of the solid-state imaging device according to the first embodiment. In other words, the thickness of the epitaxially-grown semiconductor substrate 30 is equal to the total of the pixel isolation layer 36 having a depth of about 2.4 μm and the p-type a-SiC layer 37 having a depth of about 1.5 μm in the first embodiment, that is, about 3.9 μm.

2. Manufacturing Method

Next, a method of manufacturing the solid-state imaging device according to the embodiment will be described. In the method of manufacturing the solid-state imaging device according to the embodiment, the pixel isolation layer 36 is formed to the limit depth of the acceleration voltage of the pixel isolation layer 36 formed by the implantation of B ions in the semiconductor substrate 30, after which the p-type a-SiC layer 37 connected to at least a part of the pixel isolation layer 36 is further formed in the semiconductor substrate 30.

The manufacturing method of the embodiment will be described with reference to FIGS. 11 to 14.

First, description will be given with reference to FIG. 11. FIG. 11 shows a state where boron ions are doped to the surface of the semiconductor substrate 30 with acceleration voltage of about 3.0 eV in FIG. 4 in the first embodiment. With the acceleration voltage of about 3.0 eV as the device limit, the pixel isolation layer 36 is formed to the depth of about 2.4 μm. In the embodiment, the thickness of the epitaxial-grown n-type semiconductor substrate 30 is about 3.9 μm which is greater than that of the pixel isolation layer 36.

Therefore, the bottom of the pixel isolation layer 36 formed is positioned in some midpoint in the semiconductor substrate 30.

Next, by the process of FIG. 5 in the first embodiment, the interlayer insulating film 21, the interconnect layer 22, and the first supporting substrate 20 are formed on the semiconductor substrate 30.

After that, by performing a predetermined process in a manner similar to the method described with reference to FIGS. 6 to 8 in the first embodiment, the p-type a-SiC film 37 is buried in the trench 55. As a result, the configuration of FIG. 12 is obtained.

At this time, the a-SiC film 37 is deposited also on the semiconductor substrate 30. The depth of the trench 55 is about 1.5 µm. Therefore, the bottom of the trench 55 is connected to at least a part of the pixel isolation layer 36. The film formation parameters of the a-SiC film 37 and the characteristic of the film are similar to those of the first embodiment.

Finally, by performing the process described with reference to FIG. 9 in the first embodiment, the configuration shown in FIG. 13 can be obtained.

3. Effects

With the solid-state imaging device according to the second embodiment and the method of manufacturing the same, in addition to the effects (1) to (3), at least the following effect (4) can be obtained.

(4) Deterioration in sensitivity can be suppressed.

With the solid-state imaging device according to the embodiment and the method of manufacturing the same, the epitaxially-grown semiconductor substrate 30 is thicker than that of the first embodiment. That is, the thickness of the semiconductor substrate 30 is equal to the total of the height of the pixel isolation layer 36 formed with the maximum acceleration voltage and the height of the a-SiC layer 37 formed below the pixel isolation layer 36.

Therefore, deterioration in sensitivity can be suppressed as compared with that in the solid-state imaging device according to the first embodiment. The suppression of deterioration in sensitivity will be described below. With light which is incident on the back side and passes through the color filters CF, electrons are generated by light irradiation of, for example, red, green, and blue in the semiconductor layer 30 (electrons are generated by photoelectric conversion).

The ratio of light absorption in the Si substrate can be expressed by $A*\exp^{-\alpha x}$ (A: actual number, $\alpha$: absorption coefficient of light in the Si substrate, and x: depth in the Si substrate). For example, with respect to blue light, the absorption coefficient of light in Si is large. The absorption coefficient decreases as the color is becoming red. That is, blue light is absorbed in Si within short distance and electrons are generated by photoelectric conversion, so that light attenuates within short distance.

Conversely, since the absorption coefficient in Si of red light having a wavelength longer than that of blue light is small, longer distance is necessary until the red light attenuates (the region of the Si film which performs photoelectric conversion is wider at the time of irradiation of red (R) light than that at the time of irradiation of blue (B) light). Until the light of blue having shorter wavelength reaches the photodiode PD from the back side, almost all of it is photoelectrically converted in the Si substrate, and electrons are generated. Conversely, as the light becomes green or red having a longer wavelength, the light of green or red reaches the photodiode PD without being wholly photoelectrically converted to electrons until it reaches the photodiode PD from the back side.

However, in the solid-state imaging device according to the embodiment and the method of manufacturing the same, the semiconductor substrate 30 thicker than that in the first embodiment can be manufactured (the region of Si performing the photoelectric conversion can be made wider). Therefore, the region in which light having information of green and red can be photoelectrically converted is widened, so that the sensitivity can be improved.

Third Embodiment

A solid-state imaging device according to a third embodiment and a method of manufacturing the same will be described.

1. Configuration Example

A solid-state imaging device according to the embodiment and a method of manufacturing the same are different from that according to the second embodiment with respect to the semiconductor substrate 30 having a thickness of 2.4 µm. Only the point different from the second embodiment will be described, and the same reference number denotes the same member.

This state is shown in FIG. 14. FIG. 14 is a cross-sectional view of the solid-state imaging device according to the embodiment. As shown in the diagram, in the n-type semiconductor substrate 30 which is epitaxially grown to a thickness of 2.4 µm, the pixel isolation layer 36 and the a-SiC film 37 in contact with the pixel isolation layer 36 are provided.

In this case, the acceleration voltage for forming the pixel isolation layer 36 is decreased from the maximum output, and boron ions are doped. The depth of the pixel isolation layer 36 formed in the semiconductor substrate 30 is, for example, 1.7 µm.

In the embodiment, the depth of the trench formed in the surface of the semiconductor substrate 30 is, for example, 0.7 µm. Since the manufacturing method is similar to the above except that the depth of the trench 55 at the time of etching, by RIE, the trench 55 which is in contact with at least a part of the pixel isolation layer 36 formed in the semiconductor substrate 30 is different, the description will not be given.

2. Effects

Also in the solid-state imaging device according to the third embodiment and the method of manufacturing the same, the effects (1) to (3) can be obtained. In the solid-state imaging device according to the embodiment, the element isolation for electrically isolating the adjacent photodiodes PD is formed by the pixel isolation layer 36 and the a-SiC film 37 at least a part of which is in contact with the pixel isolation layer 36. In the interface between the a-SiC film 37 buried in the trench 55 and the semiconductor substrate 30, the hole storage layer 38 is formed. In such a manner, the configuration according to the embodiment can also produce the above-described effects (1) to (3).

Modification (Example of a-SiN)

A solid-state imaging device according to a modification of the first to third embodiments and a method of manufacturing the same will be described.

1. Configuration Example

In the modification, in place of the p-type a-SiC film 37, a p-type amorphous silicon nitride (a-SiN) film is applied. That is, an a-SiN film may be buried in the trench 55.

2. Manufacturing Method

Next, a method of manufacturing a solid-state imaging device according to the modification will be described. The same processes as those in the first to third embodiments will not be described, and the same reference number denotes the same member.

In the solid-state imaging device according to the modification, gaseous $NH_3$ is used in place of methane ($CH_4$) in film formation parameters of the p-type a-SiC film 37. With the gas, the p-type a-SiN film can be formed. As the film characteristic of the a-SiN film, the a-SiN film has a band gap of about 1.9 eV. That is, like the a-SiC film 37, the pixel isolation layer 36 can be reinforced.

3. Effects

Also when the solid-state imaging device according to the modification and the method of manufacturing the same are applied to the first to third embodiments, the effects (1) to (4) can be obtained in each of the embodiments. Specifically, the solid-state imaging device according to the first embodiment and the method of manufacturing the same can produce the effects (1) to (3), and the solid-state imaging device according to the second embodiment and the method of manufacturing the same can produce the effect (4) in addition to the effects (1) to (3). Further, the solid-state imaging device according to the third embodiment and the method of manufacturing the same can produce the effects (1) to (3).

In the first to third embodiments and their modifications, the silicon oxide film 51 is not limited to the silicon oxide film left by using the SOI substrate but may be, for example, a natural oxide film having a thickness of about 2 nm in the case of using a bulk substrate.

Each of the p-type a-SiC film 37 and the p-type a-SiN film does not have to be the p type but may be of the i type (non-doped).

The width wt of the trench 55 is less than the width "w" of the pixel isolation layer 36. That is, since wt only needs to be less than the width "w" of the pixel isolation layer 36, the relation may be w2>wt, w1>wt, or w0>wt.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
   a diffusion layer of a first conduction type formed in a surface of a semiconductor substrate of the first conduction type, the diffusion layer functioning as a charge accumulation part for accumulating electrons generated in the semiconductor substrate by light emitted from a back side of the semiconductor substrate to a surface side;
   first and second diffusion layers of a second conduction type sandwiching the charge accumulation part and formed so as to reach the inside of the semiconductor substrate from the surface of the semiconductor substrate; and
   p-type amorphous silicon compound electrically isolating the charge accumulation part and buried in the first and second trenches formed on the back side of the semiconductor substrate.

2. The device according to claim 1, wherein the p-amorphous silicon compound is a compound containing either carbon (C) or nitrogen (N).

3. The device according to claim 1, wherein in the semiconductor substrate, the first trench is formed in the first diffusion layer, and the second trench is formed in the second diffusion layer.

4. The device according to claim 1, wherein the first diffusion layer is connected to at least a part of a bottom face of the first trench in the semiconductor substrate, and
   the second diffusion layer is connected to at least a part of a bottom face of the second trench.

5. The device according to claim 1, wherein electric field make the generated electrons concentrated in the charge accumulation part, is generated in the semiconductor substrate, and
   depth of the first and second trenches formed in the first and second diffusion layers corresponds to a region whose electric field is weaker than that of a periphery of the charge accumulation part.

6. The device according to claim 1, wherein a band gap width of the p-amorphous silicon compound is greater than that of a material used for the semiconductor substrate.

7. The device according to claim 4, wherein a thickness of the semiconductor substrate is either a first film thickness or a second film thickness greater than the first film thickness.

8. A solid-state imaging device comprising:
   a semiconductor layer of a first conduction type, the semiconductor layer having a surface in which a first diffusion layer of the first conduction type and a second diffusion layer are formed apart from each other; and
   a pixel isolation layer of a second conduction type formed in the semiconductor layer and preventing electrons, generated by light emitted from a back side of the semiconductor substrate toward the surface side, from being accumulated in the adjacent second diffusion layer, a band gap width of the pixel isolation layer being greater than that of the semiconductor layer.

9. The device according to claim 8, further comprising:
   a first trench electrically isolating the first and second diffusion layers and being formed in the back side of the semiconductor layer, and
   a p-type amorphous silicon compound buried in the first trench, the p-type amorphous silicon compound containing either carbon (C) or nitrogen (N),
   wherein the first trench is formed in the pixel isolation layer.

10. The device according to claim 8, further comprising:
    a first trench electrically isolating the first and second diffusion layers and formed in the back side of the semiconductor layer; and
    a p-type amorphous silicon compound buried in the first trench, the p-type amorphous silicon compound containing either carbon (C) or nitrogen (N),
    wherein a bottom face of the first trench is connected to at least a part of the pixel isolation layer.

11. The device according to claim 9, wherein electric field make the generated electrons concentrated to the first and second diffusion layers, is generated in the semiconductor layer, and
    a depth of the first trench formed in the pixel isolation layer corresponds to a region whose electric field is weaker than that of a periphery of the first and second diffusion layers.

12. The device according to claim 8, wherein a thickness of the semiconductor layer is either a first film thickness or a second film thickness greater than the first film thickness.

13. The device according to claim 8, further comprising:
    a first trench electrically isolating the first and second diffusion layers and formed on the back side of the semiconductor layer; and
    an i-type amorphous silicon compound buried in the first trench, the i-type amorphous silicon compound being a compound containing either carbon (C) or nitrogen (N).

\* \* \* \* \*